United States Patent [19]
Shimizume et al.

[11] Patent Number: 4,733,405
[45] Date of Patent: Mar. 22, 1988

[54] DIGITAL INTEGRATED CIRCUIT

[75] Inventors: Kazutoshi Shimizume; Takeshi Uematsu; Tetsu Haga, all of Kanagawa; Youhei Hasegawa, Tokyo, all of Japan

[73] Assignee: Sony Corporation, Tokyo, Japan

[21] Appl. No.: 918,150

[22] Filed: Oct. 14, 1986

[30] Foreign Application Priority Data

| Oct. 15, 1985 | [JP] | Japan | 60-229319 |
| Mar. 15, 1986 | [JP] | Japan | 61-058931 |
| Apr. 21, 1986 | [JP] | Japan | 61-091828 |
| Apr. 21, 1986 | [JP] | Japan | 61-091827 |

[51] Int. Cl.$^4$ .................. G11C 29/00; G11C 19/28
[52] U.S. Cl. .................. 377/29; 377/70; 377/77; 371/25; 307/481; 307/279; 324/73 R
[58] Field of Search ............... 371/25; 307/465, 279, 307/448, 453; 377/70, 29, 28, 78, 79, 77; 364/716, 717; 324/73 R

[56] References Cited

U.S. PATENT DOCUMENTS

| 4,291,386 | 9/1981 | Bass | 364/717 |
| 4,408,298 | 10/1983 | Ruhland | 364/717 |
| 4,418,418 | 11/1983 | Aoki | 377/79 |
| 4,534,028 | 8/1985 | Trishler | 371/25 |
| 4,534,030 | 8/1985 | Paez et al. | 371/25 |
| 4,590,601 | 5/1986 | Beeman | 364/717 |
| 4,597,042 | 6/1986 | d'Angeac et al. | 371/25 |
| 4,601,033 | 7/1986 | Whelan | 371/25 |
| 4,611,183 | 9/1986 | Piosenka et al. | 364/717 |
| 4,613,773 | 9/1986 | Koike | 377/79 |

Primary Examiner—John S. Heyman
Attorney, Agent, or Firm—Hill, Van Santen, Steadman & Simpson

[57] ABSTRACT

A digital integrated circuit incorporates a plurality of multi-port flip-flop circuits which are interconnected by a plurality of gate circuits. A separate source of clock pulses is provided for each of the ports of the multi-port flip-flop circuits, and each clock pulse source is selectively effective to cause the multi-port flip-flop circuits to perform independent functions. During operation under one source of clock pulses, the flip-flops perform their ordinary function as D type flip-flops. During operation under another source of clock pulses, the flip-flops function as one or more shift registers in order to set the flip-flops to a predefined initial state in accordance with serial input data, and/or to provide serial output data in response to the state of the flip-flops following a preceding operation. When a further source of clock pulses is effective, a plurality of flip-flops may be connected to function as a random number generator or as a signature generator so as to perform repetitive operations such as cycling the address inputs of a ROM and providing output signals corresponding to the operation of the ROM.

16 Claims, 10 Drawing Figures

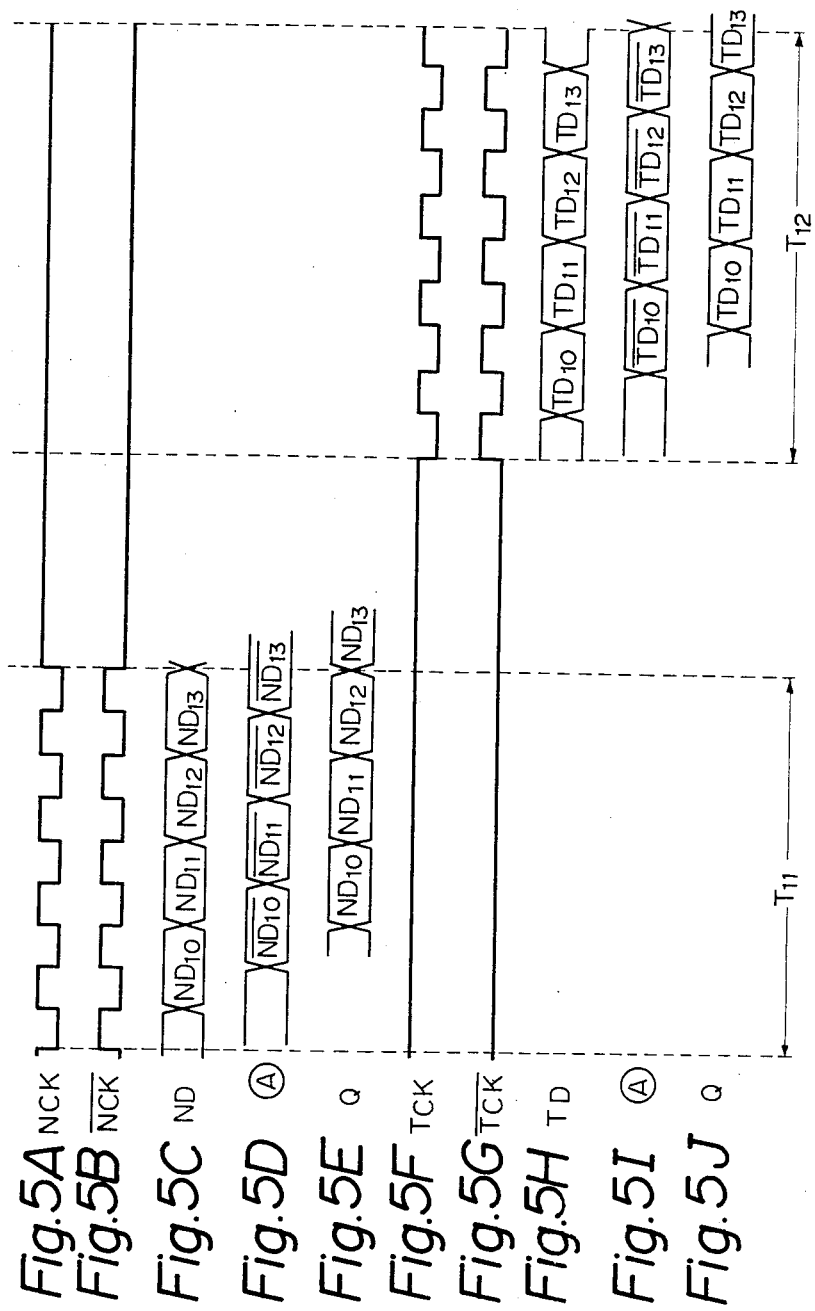

Fig. 10A CK
Fig. 10B SCK
Fig. 10C GCK
Fig. 10D
Fig. 10E
Fig. 10F

DIGITAL INTEGRATED CIRCUIT

BACKGROUND OF THE INVENTION

1. Field of the Invention

This invention relates to a digital integrated circuit and, more particularly, to a digital integrated circuit which can perform plural functions with common circuit elements.

2. Description of the Prior Art

A digital circuit is constructed of flip-flops and combination gate circuits. In an LSI (large scale integrated circuit), the number of flip-flops and combination gate circuits disposed on the same chip becomes extremely large with an increase in circuit size. As a result, the test criteria for determining its quality becomes difficult.

Conventionally, a test of such an LSI circuit is made to determine its quality by giving a test pattern to the LSI, setting an internal state of the LSI, and comparing the output pattern of the LSI with an expected value. It is easy to set an arbitrary state, in internal logic, close to an input terminal to which the test pattern is input. However, analysis of the output of the test result is difficult. This is because, although controllability is satisfactory, observability is not good. In contrast, although it is easy to observe the output of the part close to an output terminal, the arbitrary setting of the internal logic is difficult. In other words, the observability is satisfactory but the controllability is not good.

Therefore, a scan-path test method has been proposed as a method for efficiently performing an LSI test. In the scan-path test method, a test mode is provided separately from the normal mode, as an operational mode of the LSI. The flip-flops in the LSI operate as a shift register in the test mode. Data is serially transferred to each of the flip-flops by bypassing the gate circuits so that each flip-flop can be set in an arbitrary state. Also, the output of each flip-flop is transferred by bypassing the gate circuit, in the test mode, which is connected to the output terminal. Consequently, the controllability can be improved with the enhancement of the observavility in the scan-path test method.

Since test steps can be established in this scan-path test method, automation is easy. In addition, because of the improvement of both the controllability and the observability, a fault location test to determine which part in an LSI causes a malfunction can be made with a fault detection test, to decide the quality of the LSI.

To perform the LSI test by the scan-path test method, it is necessary to constitute the flip-flops of the LSI with two-port flip-flops, which can independently operate in the normal mode and in the test mode, and which can receive two inputs in dependence on the selected mode.

As described above, in order to independently execute a plurality of modes, including the test mode and the normal mode, it is also necessary to provide multi-port flip-flops which can operate by the independent clocks corresponding to the respective modes.

FIG. 1 shows an example of a conventional two-port flip-flop. This two-port flip-flop is constituted by a selector 61 for selecting an input signal and selecting a clock source, depending on mode, and a D type flip-flop 62. The selector 61 is composed of AND gates 63-66 and OR gates 67 and 68.

A mode setting signal is supplied from a mode setting signal input terminal 69 to one input terminal of each of the AND gates 64 and 66. The inverted mode setting signal is given from the input termanal 69 to one input terminal of each of the AND gates 63 and 65. Data ND in the normal mode is supplied from an input terminal 70 to the other input terminal of the AND gate 63. Data TD in the test mode is supplied to the other input terminal of the AND gate 64 from an input terminal 71. A clock NCK in the normal mode is fed to the other input terminal of the AND gate 65 from a clock input terminal 72. A clock TCK in the test mode is supplied to another input terminal of the AND gate 66 from a clock input terminal 73.

The outputs of the AND gates 63 and 64 are supplied to the OR gate 67. The outputs of the AND gates 65 and 66 are supplied to the OR gate 68. The output of the OR gate 67 is supplied to the data input terminal of the D type flip-flop 62. The output of the OR gate 68 is supplied to the clock input terminal of the D type flip-flop 62. The output of the D type flip-flop 62 is output from an output terminal 74.

A low level signal is supplied to the mode setting signal input terminal 69 in the normal mode. When the low level signal is supplied to the input terminal 69, the data ND from the input terminal 70 is supplied through the AND gate 63 and the OR gate 67 to the D type flip-flop 62 and, simultaneously, the clock NCK from the clock input terminal 72 is supplied to the flip-flop 62 via the AND gate 65 and the OR gate 68.

Under the test mode, a high level signal is supplied to the input terminal 69. In response to the high level signal applied to the input terminal 69, the test data TD from the input terminal 71 is supplied to the flip-flop 62 through the AND gate 64 and the OR gate 67. The test clock TCK from the clock input terminal 73 is supplied to the flip-flop 62 through the AND gate 66 and the OR gate 68.

As described above, the conventional two-port flip-flop needs the selector 61 comprising the AND gates 63 and 66 and the OR gates 67 and 68, in addition to the flip-flop 62, resulting in an increase in circuit size. Therefore, if an integrated circuit is constituted using multi-port flip-flops such as the foregoing two-port flip-flop, in order to accomplish a plurality of functions by use of the common circuit elements, there is the problem such that the required chip area increases. In addition, since the input data is supplied to the D type flip-flops through a plurality of gates, there is also the drawback that a delay occurs, caused by these gates, and it is difficult to realize a high operating speed. Further, the electric power consumption is increased, due to the increase in number of elements, so that problems such as heat generation and the like occur.

OBJECTS AND SUMMARY OF THE INVENTION

Accordingly, it is an object of the present invention to provide an improved digital integrated circuit having a multiport flip-flop circuit.

Another object of the invention is to provide a digital integrated circuit with a small chip area.

Still another object of the invention is to provide a digital integrated circuit with a high operating speed.

Still another object of the invention is to provide a digital integrated circuit with a testable construction.

According to one aspect of the present invention, there is provided a digital integrated circuit comprising: plural flip-flop circuits and plural gate circuits; a part of the plural flip-flop circuits being multi-port flip-flop circuits and each including at least first and second data input terminals supplied with first and second data, respectively; first and second gate transistors connected to the first and second data input terminals, respectively, the first and second data transistors being controlled by first and second clock signals, respectively; a first inverting circuit connected to the first and second gate transistors; third and fourth gate transistors serially connected to the first inverting circuit and a second inverting circuit connected to the series circuit of the third and fourth gate transistors, wherein a circuit portion including the multi-port flip-flop circuits can perform plural functions independently with the selection of the clock signal supplied to the multi-port flip-flop circuits.

The above and other objects and features of the present invention will become apparent from the following detailed description and the appended claims, with reference to the accompanying drawings.

BRIEF DESCRIPTION OF THE DRAWINGS

FIGS. 5A to 5J are timing charts for explaining the operation of the flip-flop in FIG. 4;

FIGS. 10A to 10F are timing charts for explaining the operation of the flip-flop in FIG. 9.

DESCRIPTION OF THE PREFERRED EMBODIMENTS

Figure 1:
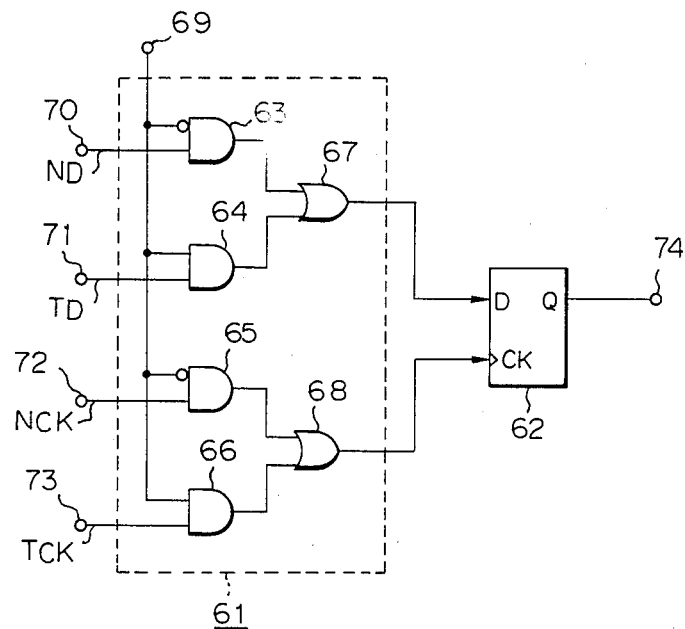
FIG. 1 is a block diagram of a conventional two-port flip-flop.
Figure 2:
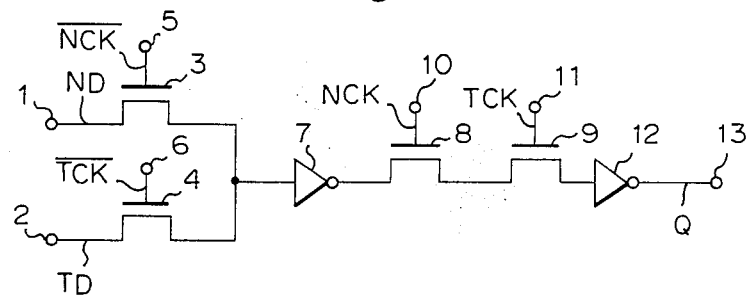
FIG. 2 is a circuit diagram of a two-port flip-flop of the dynamic type which is used in an integrated circuit according to the present invention.

FIG. 2 shows an example of a two-port flip-flop for use in the invention. The two-port flip-flop has a dynamic type structure. In FIG. 2, reference numeral 1 denotes an input terminal to which data ND is supplied in the normal mode and 2 indicates an input terminal to which test data TD is given in the test mode. An MOS transistor 3 is connected between the input terminal 1 and the input terminal of an inverter 7. An MOS transistor 4 is connected between the input terminal 2 and the input terminal of the inverter 7. The gate of the MOS transistor 3 is coupled to an input terminal 5 for an inverted clock $\overline{NCK}$ in the normal mode. The gate of the MOS transistor 4 is connected to an input terminal 6 for an inverted clock $\overline{TCK}$ in the test mode. A serial connection consisting of MOS transistors 8 and 9 is connected between the output terminal of the inverter 7 and the input terminal of an inverter 12. The gate of the MOS transistor 8 is coupled to an input terminal 10 for a clock NCK in the normal mode. The gate of the MOS transistor 9 is connected to an input terminal 11 for a clock TCK in the test mode. The output terminal of the inverter 12 is coupled to an output terminal 13.

In the normal mode, the clock TCK in the test mode assumes a constant high level and its inverted clock $\overline{CLK}$ is at a constant low level. For this reason, a low level signal is given to the clock input terminal 6 in the normal mode, whereas a high level signal is supplied to the clock input terminal 11. The MOS transistor 4 is consequently kept in the OFF state and the MOS transistor 9 is maintained in the ON state.

Under this state, the clock NCK in the normal mode is supplied to the clock input terminal 10 and its inverted clock $\overline{NCK}$ is supplied to the clock input terminal 5. In response to the high level inverted clock $\overline{NCK}$ in the normal mode, the MOS transistor 3 is turned on to transfer the data ND from the input terminal 1 to the inverter 7 via the MOS transistor 3. The output of the inverter 7 is supplied to the MOS transistor 8 and stored into the capacitance of the MOS transistor 8. The MOS transistor 8 is turned on by the high level clock NCK in the normal mode In the normal mode, the MOS transistor 9 is kept in the ON state. Thus, the output stored in the capacitance of the transistor 8 is fed through the MOS transistor 9 to the inverter 12 in response to the leading edge of the clock NCK in the normal mode, so that the output of the inverter 12 is taken out of the output terminal 13 as an output Q.

In the test mode, the clock NCK in the normal mode is kept at a constant high level, whereas the inverted clock $\overline{NCK}$ is maintained at a constant low level. Therefore, a low level signal is supplied to the clock input terminal 5 in the test mode, and a high level is supplied to the clock terminal 10. Thus, the MOS transistor 3 is maintained in the OFF state but the MOS transistor 8 is kept in the ON state.

In this state, the clock TCK in the test mode is supplied to the clook input terminal 11 and the inverted clock $\overline{TCK}$ is supplied to the clock input terminal 6. In response to the high level inverted clock $\overline{TCK}$ in the normal mode, the MOS transistor 4 is turned on to transmit the test data TD from the input terminal 2 to the inverter 7 through the MOS transistor 4. Since the MOS transistor 8 is held in the ON state in the test mode, the output of the inverter 7 is stored into the capacitance of the MOS transistor 9 through the MOS transistor 8. When the clock TCK in the test mode is at a high level, the MOS transistor 9 is turned on and the output stored in the capacitance of the MOS transistor 9 is derived via the inverter 12 from the output terminal 13 as the output Q.

Figure 3:
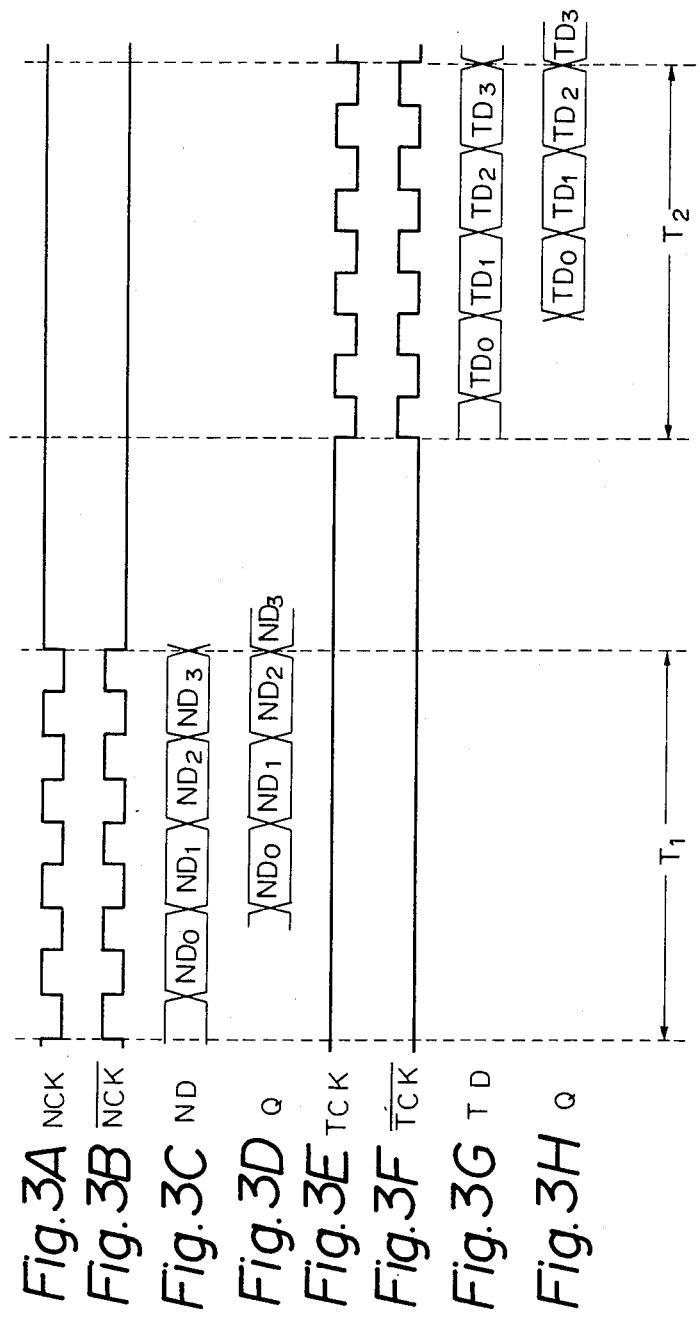
FIGS. 3A to 3H are timing charts for explaining the operation of the flip-flop in FIG. 2.

In FIGS. 3E and 3F, it is assumed that the clock TCK supplied to the clock input terminal 11 in the test mode is at a constant high level during a period of time shown at $T_1$ in these timing charts, respectively, and that the inverted clock $\overline{TCK}$ supplied to the clock input terminal 6 is contrarily at a constant low level. As shown in FIGS. 3A and 3B, the clock NCK and the inverted clock $\overline{NCK}$ in the normal mode are supplied to the clock terminals 10 and 5 (FIG. 2).

Because the MOS transistor 4 is turned off in this state, the data TD (FIG. 3G) from the input terminal 2 is not input. As shown in FIG. 3C, data $ND_n$ ($ND_0$, $ND_1$, $ND_2$, ...) is supplied to the input terminal 1 and inverted by the inverter 7 and stored into the capacitance of the MOS transistor 8. The inverted clock $\overline{NCK}$ is at a high level in the normal mode. In response to the high level clock NCK in the normal mode, the MOS transistor 8 is turned on so that the output of the MOS transistor 8 is inverted though the MOS transistor 9 and the inverter 12. The inverted output is taken out of the output terminal 13. Thus, the output Q from the output terminal 13 changes in response to the leading edge of the clock NCK in the normal mode. As shown in FIG. 3D, the data of which the input data $ND_n$ ($ND_0$, $ND_1$, $ND_2$, ...) was delayed by one clock is taken out of the output terminal 13.

In FIGS. 3A and 3B, it is assumed that the clock NCK supplied to the clock input terminal 10 in the normal mode is at a constant high level during a period of time shown at $T_2$ in these timing charts and that the inverted clock $\overline{NCK}$ supplied to the clock input terminal 4 is at a constant low level. As shown in FIGS. 3E and 3F, the clock TCK and the inverted clock $\overline{TCK}$ in the test mode are transmitted to the clock input terminals 11 and 6 (FIG. 2).

Since the MOS transistor 2 is turned off in this state, the data $ND_n$ (FIG. 3C) from the input terminal 1 is not input. As shown in FIG. 3G, data $TD_n$ ($TD_0$, $TD_1$, $TD_2$, ...) is supplied to the input terminal 2 and inverted by the inverter 7. This inverted data is supplied to the MOS transistor 9 and stored into the capacitance of the MOS transistor 9. On the other hand, the inverted clock $\overline{TCK}$ is at a high level in the test mode. In response to the high level clock TCK in the test mode, the MOS transistor 9 is turned on. Thus, the output of the MOS transistor 9 is inverted by the inverter 12 and taken out of the output terminal 13. Therefore, the output Q of the output terminal 13 changes in response to the leading edge of the clock TCK in the test mode. As shown in FIG. 3H, the data corresponding to the input data $TD_n$ ($TD_0$, $TD_1$, $TD_2$, ...), delayed by one clock is taken out of the output terminal 13.

As described above, the two-port flip-flop shown in FIG. 2 operates as a D type flip-flop for the input data $ND_n$, by supplying the clock NCK and the inverted clock $\overline{NCK}$ in the normal mode with the clock TCK and the inverted clock $\overline{TCK}$ held at a high level and a low level, respectively. On the other hand, the two-port flip-flop operates as a D type flip-flop for the input data $TD_n$ by supplying the clock TCK and the inverted clock $\overline{TCK}$ in the test mode with the clock NCK and the inverted clock $\overline{NCK}$ held at a high level and a low level. The clocks which are supplied to the clock input terminals 10 and 11 in FIG. 2 may be referred to as the clock TCK in the test mode and the clock NCK in the normal mode, respectively. Alternatively, the constitution shown in the diagram may be also reversed.

Figure 4:
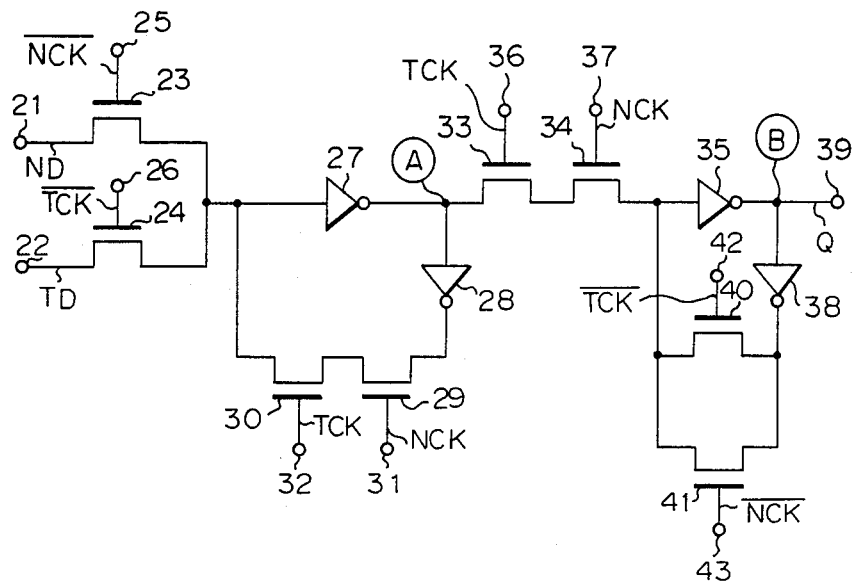
FIG. 4 is a circuit diagram of a two-port flip-flop of a static system which is used in an integrated circuit of the invention.

FIG. 4 shows another example of a two-port flip-flop. This two-port flip-flop has a static type structure. In FIG. 4, the data ND in the normal mode is supplied to an input terminal 21 and the test data TD in the test mode is supplied to an input terminal 22. An MOS transistor 23 is connected between the input terminal 21 and the input terminal of an inverter 27. An MOS transistor 24 is coupled between the input terminal 22 and the input terminal of the inverter 27. The gate of the MOS transistor 23 is connected to an input terminal 25 for the inverted clock $\overline{NCK}$ in the normal mode. The gate of the transistor 24 is coupled to an input terminal 26 for the inverted clock $\overline{TCK}$ in the test mode.

The output terminal of the inverter 27 is connected to the input terminal of an inverter 28. The output terminal of the inverter 28 is connected to the node of one end of each of the MOS transistors 23 and 24 and the input terminal of the inverter 27, through a serial connection of MOS transistors 29 and 30. The gate of the MOS transistor 29 is coupled to an input terminal 31 for the clock NCK in the normal mode. The gate of the MOS transistor 30 is connected to an input terminal 32 for the clock TCK in the test mode.

The node of the output terminal of the inverter 27 and the input terminal of the inverter 28 is coupled to the input terminal of an inverter 35 through a serial connection of MOS transistors 33 and 34. The gate of the MOS transistor 33 is connected to an input terminal 36 for the clock TCK in the test mode. The gate of the MOS transistor 34 is coupled to an input terminal 37 for the clock NCK in the normal mode.

The output terminal of the inverter 35 is connected to the input terminal of an inverter 38 and to an output terminal 39. MOS transistors 40 and 41 are connected in parallel between the output terminal of the inverter 38 and the input terminal of the inverter 35. The gate of the MOS transistor 40 is coupled to an input terminal 42 for the inverted clock $\overline{TCK}$ in the test mode. The gate of the MOS transistor 41 is connected to an input terminal 43 for the inverted clock $\overline{NCK}$ in the normal mode.

In the normal mode, the clock TCK supplied to the clock input terminals 32 and 36 in the test mode is kept at a constant high level. On the contrary, the inverted clock $\overline{TCK}$ supplied to the clock input terminals 26 and 42 in the test mode is held at a constant low level. Thus, the MOS transistors 30 and 33 are held in the ON state but the MOS transistors 24 and 40 are kept in the OFF state.

In this state, the clock signals NCK and $\overline{NCK}$ in the normal mode are transmitted to the clock input terminals 31, 37 and 25, 43. In response to the high level inverted clock $\overline{NCK}$ in normal mode, the MOS transistor 23 is turned on to supply the data ND from the input terminal 21 to the inverter 27 through the MOS transistor 23. With the low level inverted clock $\overline{NCK}$ and the high level clock NCK in the normal mode, the MOS transistor 29 is turned on. Since the MOS transistor 30 is held in the ON state in the normal mode, the output of the inverter 27 is returned to its input terminal via the inverter 28 and the MOS transistors 29 and 30 by the ON state of the MOS transistor 29. Therefore, while the clock NCK in the normal mode is at a high level, data is retained at a node A of the output terminal of the inverter 27 and the input terminal of the inverter 28.

Now, assuming that the clock NCK in the normal mode is at a high level, the MOS transistor 34 is turned on. Since the MOS transistor 33 is held in the ON state in the normal mode, when the MOS transistor 34 is turned on, the output of the node A is supplied to the input terminal of the inverter 35 via the MOS transistors 33 and 34.

The MOS transistor 41 is turned on by the high level inverted clock $\overline{NCK}$ in the normal mode. The output of the inverter 35 is consequently returned to its input terminal through the inverter 38 and the MOS transistor 41. Thus, while the inverted clock $\overline{NCK}$ in the normal mode is at a high level, the data is held at the node B of the output terminal of the inverter 35 and the input terminal of the inverter 38. The output of the node B is taken out of the output terminal 39.

In the test mode, the clock NCK supplied to the clock input terminals 31 and 37 in the normal mode is held at a constant high level, while the inverted clock $\overline{NCK}$ supplied to the clock input terminals 25 and 43 in the normal mode is kept at a constant low level. Therefore, the MOS transistors 29 and 34 are held in the ON state but the MOS transistors 23 and 41 are maintained in the OFF state.

In this state, the clocks TCK and $\overline{\text{TCK}}$ in the test mode are supplied to the clock input terminals 32, 36 and 26, 42. In response to the high level inverted clock $\overline{\text{TCK}}$ in the test mode, the MOS transistor 24 is turned on, so that the data TD is transferred from the input terminal 22 to the inverter 27 through the MOS transistor 24. In response to the low level inverted clock $\overline{\text{TCK}}$ and the high level clock TCK in the test mode, the MOS transistor 30 is turned on. Since the MOS transistor 29 is maintained in the ON state in the test mode, the output of the inverter 27 is returned to its input terminal through the inverter 28 and MOS transistors 29 and 30 when the MOS transistor 30 is turned on. The data is, therefore, retained at the node A while the clock TCK in the test mode is at a high level. In addition, when the level of the clock TCK in the test mode becomes high, the MOS transistor 33 is turned on. Since the MOS transistor 34 is kept in the ON state in the test mode, the data of the node A is transferred through the MOS transistors 33 and 34 to the input terminal of the inverter 35 by the turn-on of the MOS transistor 33.

In response to the high level inverted clock $\overline{\text{TCK}}$ in the test mode, the MOS transistor 40 is turned on. Thus, the output of the inverter 35 is returned to its input terminal, via the inverter 38 and the MOS transistor 40. The data at the node B is consequently held while the inverted clock $\overline{\text{TCK}}$ in the test mode is at a high level. The output of the node B is taken out of the output terminal 39.

In FIGS. 5F and 5G, the clock TCK supplied to the clock input terminals 32 and 36 in the test mode is at a constant high level during a period of time shown at $T_{11}$ in these timing charts. On the contrary, the inverted clock $\overline{\text{TCK}}$ supplied to the clock input terminals 26 and 42 in the test mode is at a constant low level. As shown in FIGS. 5A and 5B, respectively, the clock NCK and the inverted clock $\overline{\text{NCK}}$ in the normal mode are transmitted to the clock input terminals 31, 37 and the clock input terminals 25, 43.

In this state, since the MOS transistor 24 is in the OFF state, the data TD (FIG. 5H) from the input terminal 22 is not input. As shown in FIG. 5C, by supplying the data $ND_{1n}$ ($ND_{10}$, $ND_{11}$, $ND_{12}$, ...), this data is transferred to the inverter 27 while the inverted clock $\overline{\text{NCK}}$ in the normal mode is at a high level.

In response to the high level clock NCK and the low level inverted clock $\overline{\text{NCK}}$ in the normal mode, the MOS transistor 29 is turned on. Thus, the output of the inverter 27 is returned through the inverter 28 and the MOS transistors 29 and 30 to hold the data at the node A as shown in FIG. 5D while the MOS transistor 29 is on. Moreover, the output of the node A is supplied to the inverter 35, via the MOS transistors 33 and 34, since the MOS transistor 34 is turned on while the clock NCK is held at a high level.

In response to the low level clock NCK in the normal mode and the high level inverted clock $\overline{\text{NCK}}$, the MOS transistor 41 is held in the ON state. Thus, the output of the inverter 35 is returned to the inverter 35 through the inverter 38 and MOS transistor 41 so as to hold the data at the node B while the inverted clock $\overline{\text{NCK}}$ is at a high level. Therefore, the data of which the input data $ND_{1n}$ ($ND_{10}$, $ND_{11}$, $ND_{12}$, ...) was delayed by one clock is output from the output terminal 39 as shown in FIG. 5E.

In FIGS. 5A and 5B, the clock NCK supplied to the clock input terminals 31 and 37 in the normal mode is kept at a constant high level for a period of time shown at $T_{12}$ in these timing charts, respectively; however, the inverted clock $\overline{\text{NCK}}$ supplied to the input terminal 25 and 43 in the normal mode is kept at a constant low level. As shown in FIGS. 5F and 5G, respectively, the clock TCK and the inverted clock $\overline{\text{TCK}}$ in the test mode are supplied to the clock input terminals 32 and 36 and the clock input terminals 26 and 42.

In this state, since the MOS transistor 23 is OFF, the data ND (FIG. 5C) from the input terminal 21 is not input. As indicated in FIG. 5H, by supplying the data $TD_{1n}$ ($TD_{10}$, $TD_{11}$, $TD_{12}$, ...) this data is transferred to the inverter 27 while the inverted clock $\overline{\text{TCK}}$ in the test mode is at a high level.

By the high level clock TCK in the test mode and the low level inverted clock $\overline{\text{TCK}}$, the MOS transistor 30 is set into the ON state. Thus, the output of the inverter 27 is returned through the inverter 28 and the MOS transistors 29 and 30 to hold the data of the node A as shown in FIG. 5I while the clock TCK is at a high level and the MOS transistor 30 is on. Also, the output of the node A is fed through the MOS transistors 33 and 34 to the inverter 35 since the MOS transistor 33 is on while the clock TCK is kept at a high level.

By the low level clock TCK in the test mode and the high level inverted clock $\overline{\text{TCK}}$, the MOS transistor 40 is turned on. Therefore, the output of the inverter 35 is returned to the inverter 35 through the inverter 38 and MOS transistor 40 to hold the data of the node B while the inverted clock $\overline{\text{TCK}}$ is at a high level. Thus, the data of which the input data $TD_{1n}$ ($TD_{10}$, $TD_{11}$, $TD_{12}$, ...) was delayed by one clock is output from the output terminal 39 as shown in FIG. 5J.

Figure 6:
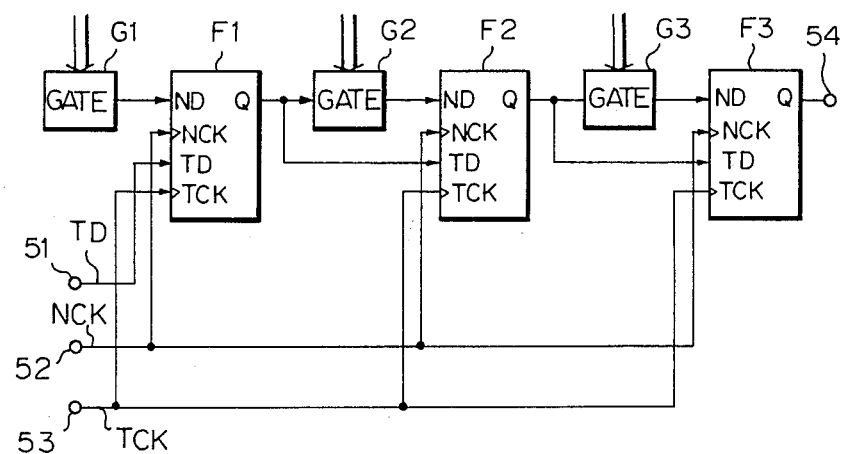
FIG. 6 is a block diagram showing an integrated circuit of one embodiment of the invention.

An integrated circuit having the testing function as shown in FIG. 6 can be achieved using the two-port flip-flops constituted as described above.

The digital circuit of FIG. 6 is composed of flip-flops and combination gate circuits. F1, F2, and F3 denote flip-flops and $G_1$, $G_2$, and $G_3$ indicate combination gate circuits, respectively. For the two-port flip-flops, units having the structures shown in FIGS. 2 and 4 may be used. The outputs of the other logic gates are supplied to the combination gate circuits G1, G2, and G3.

The output of the combination gate circuit G1 is supplied to the data input terminal of the two-port flip-flop F1. The output of the combination gate circuit G2 is supplied to the data input terminal of the two-port flip-flop F2. The output of the combination gate circuit G3 is supplied to the data input terminal of the two-port flip-flop F3. Also, the test data TD from an input terminal 51 is supplied to the test data input terminal of the two-port flip-flop F1. The output of the two-port flip-flop F1 is transferred to the test data input terminal of the two-port flip-flop F2. The output of the two-port flip-flop F2 is supplied to the test data input terminal of the two-port flip-flop F3. The clock NCK from a clock input terminal 52 is fed to the clock input terminals of the flip-flops F1, F2, and F3. The test clock TCK is transmitted to the test clock input terminals of the flip-flops F1, F2, and F3.

In the normal state of operation, a high level signal is given to the clock input terminal 53 to set the normal mode. By the clock supplied to the clock input terminal 52, the two-port flip-flops F1, F2, and F3 operate as the D type flip-flops corresponding to the combination gate circuits G1, G2, and G3, respectively.

In the case of executing the operation test, a high level signal is supplied to the clock input terminal 52 to set the test mode. In response to the test clock TCK supplied to the clock input terminal 53, the output of the flip-flop F1 is transferred to the flip-flop F2 without passing through any combination gate circuit, and the output of the flip-flop F2 is transmitted to the flip-flop F3 without passing through any combination gate circuit. Thus, the flip-flops F1 to F3 function as a shift register. Since the two-port flip-flops F1 to F3 function as a shift register in this manner, the flip-flops F1 to F3 can be set into arbitrary states by the test data TD from the input terminal 51.

As mentioned above, the integrated circuit can be tested by use of the scan-path test method, since the two-port flip-flops F1 to F3 function as a shift register in the test mode.

The following steps are repeated to test an LSI with such a scan-path method.

First, the operation mode of the integrated circuit is set into the test mode so that the data can be supplied from the input terminal 51. This data is transferred to the internal flip-flops F1 to F3, and the state of each of the flip-flops F1 to F3 is set. The operation mode of the integrated circuit is then set into the normal mode so that the outputs of the internal gate circuits G1 to G3 are transferred to the flip-flops F1 to F3. Subsequently, the operation mode of the integrated circuit is set into the test mode to take out the outputs of the respective flip-flops F1 to F3 from an output terminal 54. The output data from the output terminal 54 is compared with an expected value, thereby determining whether the output data is proper or not.

According to the embodiment, the two-port flip-flops which function as the flip-flops for the respective combination gate circuits in the normal mode, and which also function as the shift register in the test mode, can be realized by a simple structure without using any selector for selecting the input data and the input clock. The integrated circuit having the test function for allowing the test based on the scan-path method can be, therefore, accomplished without an increase in circuit size or complexity.

The foregoing embodiment is fundamentally suitable to test an LSI consisting of a combination of flip-flops and gates. However, in recently developed LSI circuits, the circuits for parallel-in/parallel-out, such as ROM (read only memory) and PLA (programmable logic array) circuits, are formed together with other circuit components on the same chip, with the improvement of greater integration. A very large number of test vectors are needed to test these circuits by the scan-path method. For example, assuming that the address space of the ROM is $2^x$ and m flip-flops are used for the scan-path, then when m data is scanned and one address is tested, the quantity of test vectors as many as $m \times 2^x$ will be necessary, since there are $2^x$ addresses. However, in the case of testing the ROM or PLA, the number of test vectors can be reduced by use of an embodiment shown in FIG. 7, which will be explained hereinbelow.

In this embodiment, the scan-path mode and the random pattern generation mode can be set in addition to the normal mode in which the ordinary operation is executed. In the scan-path mode, the test data is transferred to the flip-flops of the LSI. In the random pattern generation mode, pseudo random patterns are generated and supplied to the circuit to be tested.

Figure 7:
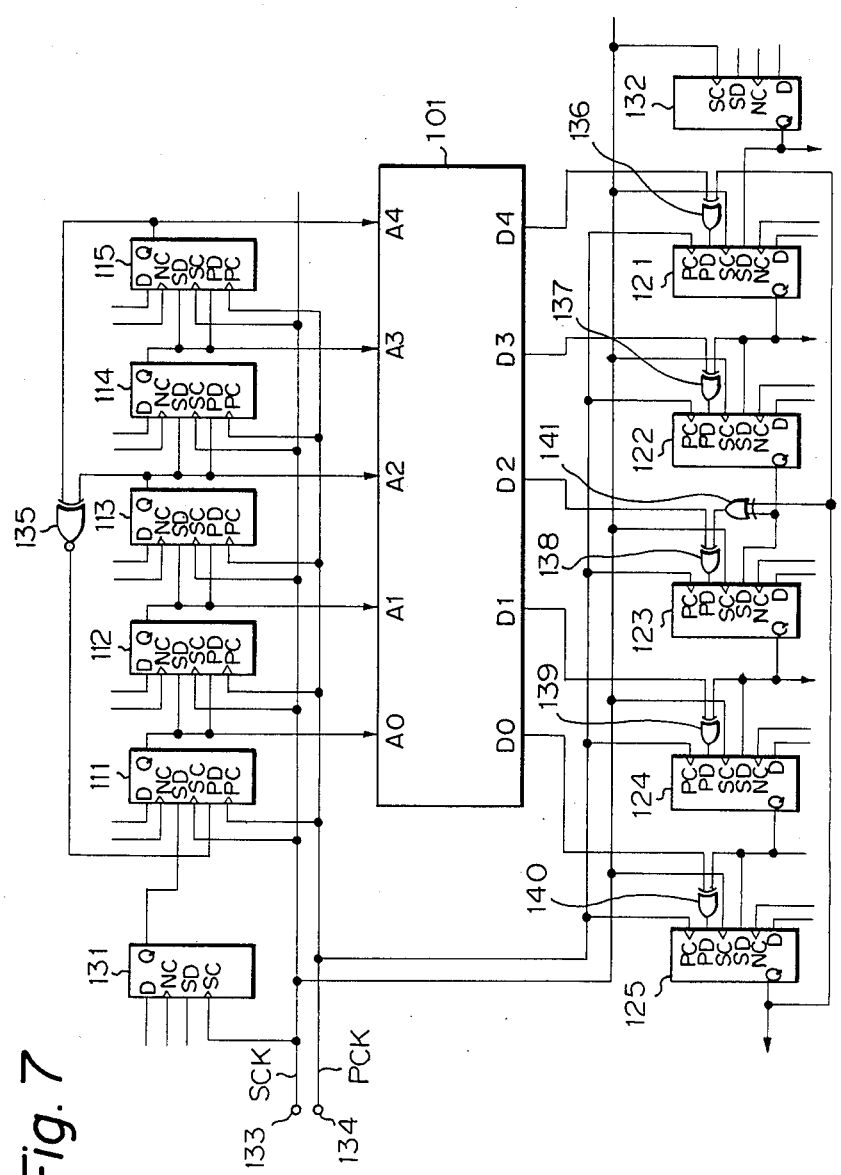
FIG. 7 is a block diagram showing an integrated circuit of another embodiment of the invention.

This embodiment will now be described hereinbelow with reference to FIG. 7. In FIG. 7, a ROM 101 is arranged in an LSI circuit, and the operation of the ROM 101 is tested. Reference numerals 111 to 115 and 121 to 125 represent three-port flip-flops, another form of a multi-port flip-flop, which are arranged on the same LSI. Two-port flip-flops 131 and 132 are arranged on the same LSI. Each of the flip-flops 111 to 115 and 121 to 125 has three data input terminals D, SD, PD, three clock input terminals NC, SC, PC, and one output terminal Q. When a clook is supplied to the clock input terminal NC, and the clock input terminals SC and PC are maintained at a high level, each of these flip-flops operates as a normal D type flip-flop for data supplied to the data input terminal D. When a clock is supplied to the clock input terminal SC, and the clock input terminals NC and PC are held at a high level, each of the flip-flops operates as a D type flip-flop for data supplied to the data input terminal SD. When a clock is supplied to the clock input terminal PC, and the clock input terminals NC and SC are kept at a high level, each of the flip-flops operates as a D type flip-flop for data supplied to the data input terminal PD.

Each of the flip-flops 131 and 132 has two data input terminals D and SD, two clock input terminals NC and SC, and one output terminal Q. When a clock is supplied to the clock input terminal NC, and the clock input terminal SC is maintained at a high level, each of the flip-flops 131 and 132 operates as a D type flip-flop for data supplied to the data input terminal D. When a clock is supplied to the clock input terminal SC, and the clock input terminal NC is held at a high level, each of the flip-flops 131 and 132 operates as a D type flip-flop, for data supplied to the data input terminal SD.

In FIG. 7, the outputs of combination gate circuits (not shown) arranged on the LSI are transferred to the data input terminals D of the three-port flip-flops 111 to 115 and 121 to 125 and two-port flip-flops 131 and 132, respectively. On the other hand, a system clock is supplied to the clock input terminals NC of the flip-flops 111 to 115, 121 to 125, 131, and 132, respectively.

In the normal mode, a high level signal is supplied to clock input terminals 133 and 134. A system clock is supplied to the clock input terminals NC of the flip-flops 111 to 115, 121 to 125, 131, and 132. Therefore, in the normal mode, these flip-flops operate as the flip-flops for the outputs of the combination gate circuits arranged on the LSI.

The output of the flip-flop 131 is supplied to the data input terminal SD of the flip-flop 111. The output of the flip-flop 111 is supplied to the data input terminal SD of the flip-flop 112. The output of the flip-flop 112 is supplied to the data input terminal SD of the flip-flop 113. The output of the flip-flop 113 is supplied to the data input terminal SD of the flip-flop 114. The output of the flip-flop 114 is supplied to the data input terminal SD of the flip-flop 115.

The output of the flip-flop 132 is supplied to the data input terminal SD of the flip-flop 121. The output of the flip-flop 121 is supplied to the data input terminal SD of the flip-flop 122. The output of the flip-flop 122 is supplied to the data input terminal SD of the flip-flop 123. The output of the flip-flop 123 is supplied to the data input terminal SD of the flip-flop 124. The output of the flip-flop 124 is supplied to the data input terminal SD of the flip-flop 125.

The scan clock SCK is supplied from the clock input terminal 133 to the clock input terminal SC of the flip-flops 111 to 115, 121 to 125, 131, and 132, respectively, In the scan-path mode, a high level signal is supplied to the clock input terminals NC of these flip-flops and to the clock input terminal 134. The scan clock SCK is supplied to the clock input terminal 133. In the scan-path mode, the flip-flops 131 and 111 to 115 operate as a shift register. The data supplied to the data input terminal SC of the flip-flop 131 is transferred to the flip-flops 131 and 111 to 115. The flip-flops 132 and 121 to 125 olperate as a shift register. The data supplied to the data input terminal SD of the flip-flop 132 is transmitted to the flip-flops 132 and 121 to 125.

The output of an exclusive-NOR (EX-NOR) gate 135 is supplied to the data input terminal PD of the flip-flop 111. The output of the flip-flop 111 is supplied to the data input terminal PD of the flip-flop 112. The output of the flip-flop 112 is supplied to the data input terminal PD of the flip-flop 113. The output of the flip-flop 113 is supplied to the data input terminal PD of the flip-flop 114. The output of the flip-flop 114 is supplied to the data input terminal PD of the flip-flop 115. The outputs of the flip-flops 113 and 115 are supplied to the input terminal of the EX-NOR gate 135.

The outputs of the exclusive-OR (EX-OR) gates 136 to 140 are supplied to the data input terminals PD of the flip-flops 121 to 125, respectively. Output data $D_4$ to $D_O$ of the ROM 101 are supplied to one input terminal of the respective EX-OR gates 136–140. The output of the three-port flip-flop 125 is supplied to the other input terminal of the EX-OR gate 136. The output of the three-port flip-flop 121 is supplied to the other input terminal of the EX-OR gate 137. The output of the EX-OR gate 141 is supplied to the other input terminal of the EX-OR gate 138. The outputs of the three flip-flops 122 and 125 are supplied to the EX-OR gate 141. The output of the three-port flip-flop 123 is supplied to the other input terminal of the EX-OR gate 139. The output of the three-port flip-flop 124 is supplied to the other input terminal of the EX-OR gate 140. A random pattern generating clock PCK is supplied from the clock input terminal 134 to the clock input terminals PC of the flip-flops 111 to 115 and 121 to 125.

In the random pattern generating mode, a high level signal is supplied to the clock input terminals NC of the flip-flops 111 to 115 and 121 to 125. A high level signal is supplied to the clock input terminal 133. In this state, the random pattern generating clock PCK is supplied to the clock input terminal 134. In the random pattern generation mode, the pseudo random patterns are generated from the flip-flops 111 to 115.

Namely, a shift register is constituted by the three-part flip-flops 111 to 115. The outputs of the flip-flops 113 and 115 are added by the EX-NOR gate 135 on the basis of modulo-2. The added data is returned to the three-port flip-flops. Therefore, a linear feedback shift register is constituted by the three-port flip-flops 111 to 115 and EX-NOR gate 135. The M-series pseudo random patterns are generated from the flip-flops 111 to 115.

The pseudo random patterns are supplied from the flip-flops 111 to 115 to addresses A0 to A4 in the ROM 101. The corresponding data is read out of the ROM 101. The output data is suppiied to the EX-OR gates 136 to 140.

On the other hand, the output of the three-port flip-flop 125 is returned to the flip-flop 121 through the EX-OR gate 136. The outputs of the three-port flip-flops 125 and 122 are added on the basis of modulo-2 and the added data is supplied to the flip-flop 123. Therefore, the M-series data is produced by the flip-flops 121 to 125 and EX-OR gate 141 and a signature analysis register is constituted.

The output data of the ROM 101 is supplied to the signature analysis register. The signature which is generated from the signature analysis register is compared with the expected value, thereby indicating whether the ROM 101 is proper or improper.

In this embodiment, the ROM 101 is tested in the following manner.

First, the scan clock SCK is supplied to the clock input terminal 133 to set into the scan-path mode. The test data is transferred from the input terminal. The flip-flops 111 to 115, 121 to 125, 131, and 132 are initialized. After these flip-flops were initialized into arbitrary states, the random pattern generating clock PCK is supplied to the terminal 134 to set into the random pattern generation mode. In response to the clock PCK supplied, the pseudo random patterns are generated from the flip-flops 111 to 115 and supplied into the addresses in the ROM 101. The output data of the ROM 101 is supplied to the signature analysis register consisting of the three-port flip-flops 121 to 125. Next, the scan clock SCK is supplied, and the circuit is set into the scan-path mode. Thus, the signatures which are output from the flip-flops 121 to 125 are transmitted to the flip-flops arranged on the LSI and taken out of the output terminal. The signatures are compared with the expected value, thereby determining whether the ROM 101 is proper or improper.

A PLA can be also tested in a manner similar to the above, with the PLA substituted for the ROM 101.

Although the generator polynomial (determined by the connections to the EX NOR gate 135) was set to $(x^5+x^2+1=0)$ in the foregoing embodiment, the generator polynomial adapted to generate random patterns is not limited to this polynomial but other generator polynomial may be also used.

Figure 8:
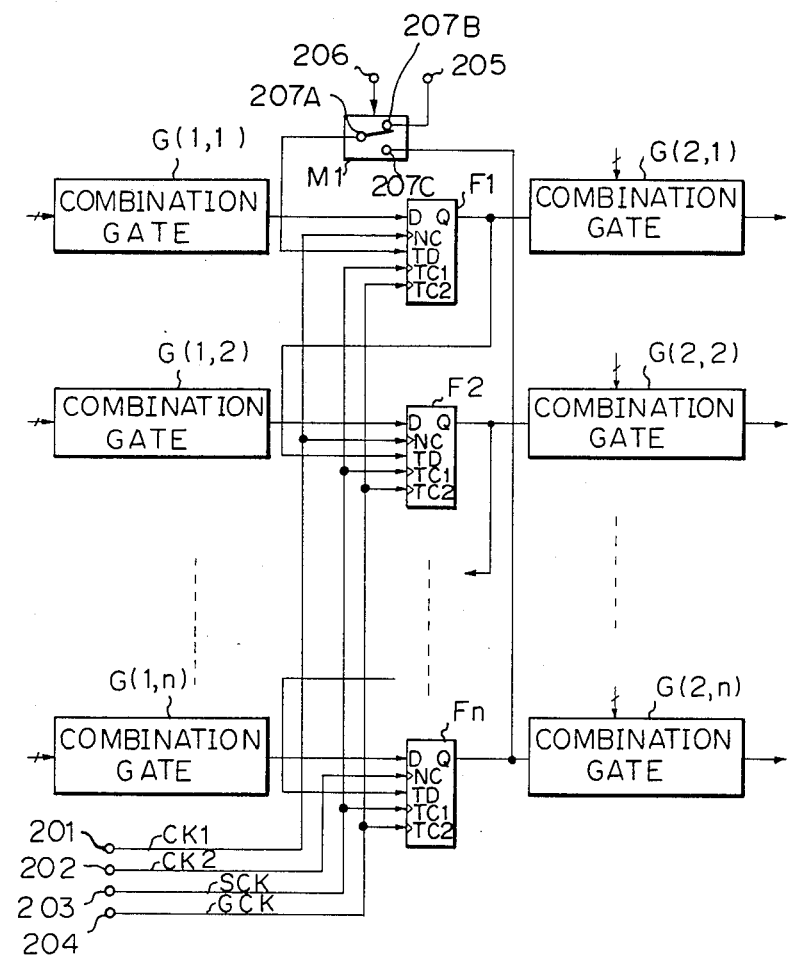
FIG. 8 is a block diagram showing an integrated circuit of a further embodiment of the invention.

As described in the above embodiment, $2^n$ test vectors are needed to test the combination gate circuit of n inputs, even in the case of an LSI on which none of the circuits such as ROM and PLA is arranged. Therefore, with an enlargement of the circuit scale, a very large number of test vectors are necessary to test the operation of the LSI. Even when random patterns are generated, and the operation of the LSI is tested by use of the random patterns, the portion having low controllability cannot be tested with a high degree of accuracy. FIG. 8 shows an embodiment which can solve such a drawback.

In FIG. 8, G (1,1) to G (1,n) and G (2,1) to G (2,n) denote combination gate circuits arranged on the LSI. F1 to Fn indicate flip-flops arranged on the LSI.

As shown in FIG. 8, each of the flip-flops F1 to Fn has two data input terminals D and TD, three clock input terminals NC, $TC_1$, and $TC_2$, and one output terminal Q. The outputs of the combination gate circuits G (1,1) to G (1,n) are supplied to the data input terminals D of the flip-flops F1 to Fn, respectively. The output of the multiplexer M1 is supplied to the data input terminal TD of the flip-flop F1. The output of the flip-flop F1 is supplied to the data output terminal TD of the flip-flop F2. Similarly, the output of the flip-flop FN-1 is supplied to the data input terminal TD of the flip-flop Fn. A system clock $CK_1$ is supplied from a clock input terminal 201 to the clock input terminals NC of the flip-flops F1 and F2. A system clock $CK_2$ is supplied from a clock input terminal 202 to the clock input terminal NC of the flip-flop Fn. A scan clock SCK is supplied from an input terminal 203 to the clock input terminals $TC_1$ of the flip-flops F1 to Fn. A random data generating clock GCK is supplied from a clock input terminal 204 to the clock input terminals $TC_2$ of the flip-flops F1 to Fn. The outputs from the output terminals Q of the flip-flops F1 to Fn are supplied to the combination gate circuits G (2,1) to G (2,n), respectively. The output from the output terminal Q of the flip-flop F1 is supplied to the data input terminal TD of the flip-flop F2. The output from the output terminal Q of the flip-flop F2 is supplied to the data input terminal TD of the flip-flop F3. The output from the output terminal Q of the flip-flop Fn is supplied to one input terminal 207C of the multiplexer M1.

The data from a terminal 205 is supplied to the other input terminal 207B of the multiplexer M1. A selection signal is supplied from a terminal 206 to the multiplexer M1.

Each of the flip-flops F1 to Fn can be set into either one of three modes. The first mode is the normal mode in which a system clock is supplied to the clook input terminal NC and a high level signal is supplied to the clock input terminals $TC_1$ and $TC_2$. In the normal mode, the flip-flops F1 to Fn operate as the flip-flops for the data supplied to the data input terminals D.

The second mode is the scan mode which is used in the case where the flip-flops F1 to Fn operate as the shift register. In the scan mode, a scan clock is supplied to the clock input terminal $TC_1$ and a high level signal is supplied to the clock input terminals NC and $TC_2$. In the scan mode, the flip-flops F1 to Fn operate as the flip-flops for the data supplied to the data input terminals TD.

The third mode is the random data generation mode in which the random data generating clock GCK is supplied to the clock input terminal $TC_2$ and a high level signal is supplied to the clock input terminals NC and $TC_2$. In the random data generation mode, the data which is supplied to the data input terminal D and the data which is supplied to the data input terminal TD are added on the basis of modulo-2 and the added data is transmitted into the flip-flops F1 to Fn.

Figure 9:
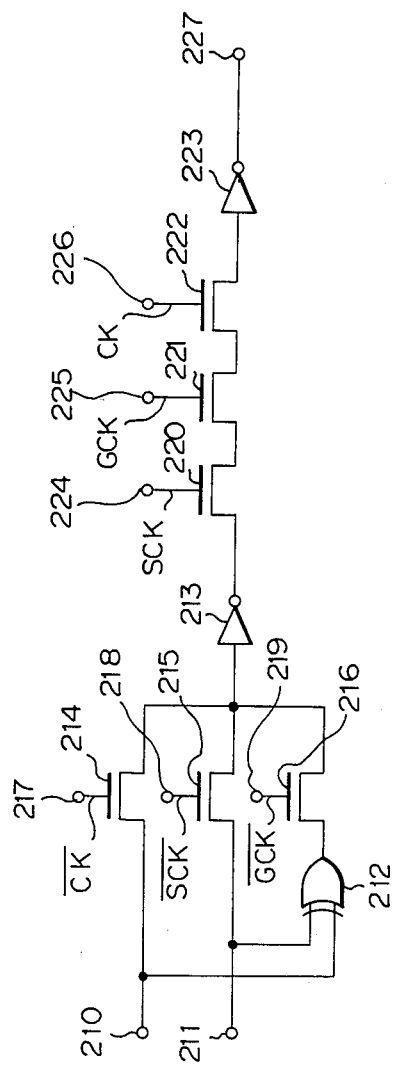
FIG. 9 is a circuit diagram of a two-port flip-flop of the dynamic type which is used in the embodiment of FIG. 8.

Each of the flip-flops F1 to Fn in FIG. 8 is constituted as shown in, e.g., FIG. 9. When comparing the arrangement of the flip-flop in FIG. 9 with that in FIG. 2, the operation will be understood, although the reference numerals are different. In the flip-flop in FIG. 9, an EX-OR gate 212, a MOS transistor 216, a clock input terminal 219 connected to the gate of the MOS transistor 216, a MOS transistor 220, and a clock input terminal 224 connected to the gate of the MOS transistor 220 are added to the flip-flop in FIG. 2.

The third mode, which is made operative by those added circuits, for the case in which random data is generated, will now be described with reference to FIG. 10.

The system clock CK and scan clock SCK are maintained at a high level. A low level signal is supplied to clock input terminals 217 and 218. A high level signal is supplied to clock input terminals 224 and 226. In this state, as shown in FIG. 10C, the random data generating clock GCK and the inverted clock $\overline{GCK}$ are supplied to the clock input terminals 225 and 219.

Since a low level signal is supplied to the clock input terminals 217 and 218. MOS transistors 214 and 215 are held in the OFF state. In addition, since a high level signal is supplied to MOS transistors 220 and 222, the MOS transistors 220 and 222 are held in the ON state. When the clock GCK becomes a high level, the MOS transistor 216 is turned on, so that the output of the EX-OR gate 212 is supplied to the input terminal of an inverter 213 through the MOS transistor 216. The output of the inverter 213 is stored into the capacitance of a MOS transistor 221.

When the clock GCK rises to a high level, the MOS transistor 221 is turned on, thereby allowing the output stored in the MOS transistor 221 to be taken out of an output terminal 227 through an inverter 223.

Therefore, as described above, a low level signal is supplied to the clock input terminals 217 and 218, a high level signal is supplied to the clock input terminals 224 and 226, and the random data generating clock $\overline{GCK}$ and the inverted clock GCK are supplied to the clock input terminals 225 and 219. Thus, as shown in FIG. 10F, the added data of modulo-2 between the data $D_0$, $D_1$, $D_2$, ... (FIG. 10D) from an input terminal 210 and the data $TD_0$, $TD_1$, $TD_2$, ... (FIG. 10E) from an input terminal 211 is delayed by one clock and taken out of the input terminal 227.

Although the example of a flip-flop of the dynamic type is shown in FIG. 9, it is also possible to constitute a static flip-flop corresponding to that shown in FIG. 9, in which the circuit of the static type flip-flop shown in FIG. 4 is used as a base circuit.

An explanation will now be made hereinbelow with respect to the operation in the case where the flip-flop circuit shown in FIG. 9 is applied to the flip-flops F1 to Fn in FIG. 8. As mentioned above, when the system clock CK is supplied to the clock input terminal NC, each of the flip-flops F1 to Fn operates as a D type flip-flop for the data supplied to the data input terminal D. When the scan clock SCK is supplied to the clock input terminal $TC_1$, each of those flip-flops operates as the D type flip-flop for the data supplied to the data input terminal TD. When the random data generating clock GCK is supplied to the clock input terminal $TC_2$, the data supplied to the data input terminal D and the data supplied to the data input terminal TD are added on the basis of modulo-2 and the added data is delayed by one clock and output.

In FIG. 8, in the normal mode, the system clocks $CK_1$ and $CK_2$ are supplied to the clock input terminals 201 and 202 and a high level signal is supplied to the clock input terminals 203 and 204.

Therefore, the system clock $CK_1$ or $CK_2$ is supplied to the clock input terminals NC of the flip-flops F1 to Fn. The outputs of the combination gate circuits G (1,1) to G (1,n) are supplied to the flip-flops F1 to F2, respectively. The outputs of the flip-flops F1 to Fn are supplied to the combination gate circuits G (2,1) to G (2,n), respectively. As mentioned above, in the normal mode, the flip-flops F1 to Fn operate as the flip-flops for the combination gate circuits G (1,1) to G (1,n).

In the case of transferring the data in the test mode, the scan clock SCK is supplied to the clock input terminal 203 and a high level signal is supplied to the clock input terminals 201, 202, and 204. The terminals 207A and 207B of the multiplexer M1 are connected.

Thus, the scan clock SCK is supplied to the clock input terminals $TC_1$ of the flip-flops F1 to Fn. The data from the terminal 205 is supplied to the data input terminal TD of the flip-flop F1. The Output of the flip-flop F1 is supplied to the data input terminal TD of the flip-flop F2. The output of the flip-flop Fn-1 is similarly supplied to the data input terminal TD of the flip-flop Fn. Therefore, in this case, the flip-flops F1 to Fn operate as a shift register. The data from the terminal 205 is transferred to the flip-flops F1 to Fn.

In the case of generating the random data in the test mode, the clock GCK is supplied to the clock input terminal 204 and a high level signal is supplied to the clock input terminals 201, 202, and 203. The terminals 207A and 207C of the multiplexer M1 are connected.

Therefore, the clock GCK is supplied to the clock input terminals $TC_2$ of the flip-flops F1 to Fn. In response to the clock GCK supplied to the terminals $TC_2$, the data supplied to the data input terminals D and the data supplied to the data input terminals TD are added on the basis of modulo-2. The added outputs are transmitted into the flip-flops F1 to Fn. The outputs of the combination gate circuits G (1,1) to G (1,n) are supplied to the data input terminals D of the flip-flops F1 to Fn, respectively. The outputs of the combination gate circuits G (1,1) to G (1,n) are determined by their inputs. The outputs of the other flip-flops are supplied to these combination gate circuits. The output of the flip-flop F1 is supplied to the data input terminal TD of the flip-flop F2. The output of the flip-flop Fn-1 is supplied to the data input terminal TD of the flip-flop Fn. The output of the flip-flop FN is supplied through the multiplexer M1 to the data input terminal TD of the flip-flop F1. Namely, the outputs of all of the flip-flops are input to the combination gate circuits. The output of the combination gate circuit is added to the output of the corresponding flip-flop on the basis of modulo-2 and the added data is input to the flip-flop. Therefore, at this time, the random pattern is generated.

The operation of the embodiment in FIG. 8 is tested in the following manner.

First, the scan clock SCK is supplied to the clock input terminal 203. The terminals 207A and 207B of the multiplexer M1 are connected to set into the scan mode. The test data is input to the terminal 205. The test data is transferred to the flip-flops F1 to Fn, so that these flip-flops are set into arbitrary states.

Next, the terminals 207A and 207C of the multiplexer M1 are connected. The random data generating clock GCK is supplied to the clock input terminal 204 to set into the random data generation mode. Thus, random patterns are generated.

After the random data generation clocks GCK (as many as necessary) were supplied, the scan mode is set. The data set in the flip-flops is taken out of the output terminals. The output data is compared with a predetermined expected value. By checking whether the data coincides with the expected value or not, it is determined whether the LSI operation is proper or improper.

The foregoing embodiment relates to the arrangement of a testable integrated circuit and was shown as an integrated circuit which can cope with the two normal and test modes. However, the invention is not limited to such a circuit but may also be applied to an arrangement such that in the normal mode, the common circuit section can be controlled by switching the clocks in a manner such that the common circuit section operates as, for example, a monostable multivibrator in the first mode and operates as a parity generating or parity check circuit in the second mode.

Although the present invention has been shown and described with respect to particular embodiments, various changes and modifications which are obvious from this disclosure to a person skilled in the art to which the invention pertains, may be made within the spirit and scope of the invention.

What is claimed is;

1. In a digital integrated circuit having a plurality of clock flip-flop circuits and including first and second sources of clock signals, one of said sources being active at a time, each of said flip-flop circuits being a multiport flip-flop circuit and comprising, in combination:
   first and second gate input terminals for receiving first and second gate, respectively,
   first and second gate transistors connected to said first and second gate input terminals, respectively, said first and second gate transistors being controlled by said first and second clock signals, respectively,
   a first inverting circuit connected to said first and second gate transistors, and
   third and fouth gate transistors serially connected to said first inverted circuit and controlled by said first and second clock signals, respectively;
   whereby said integrated circuit including said multiport flip-flop circuits can perform plural functions independently with the application of one of said first and second clock signals to said first and third gates or to said second and fourth gates of said multiport flip-flop circuits.

2. Apparatus according to claim 1, including a further inverting circuit having its input connected to the output of said first inverted circuit, and fifth and sixth gate transistors serially connected between the output of said further inverting circuit and the input of said first inverting circuit, said fifth and sixth gate transistors being controlled by said first and second clock signals, respectively.

3. Apparatus according to claim 1, including a second inverting circuit connected to said series circuit of said third and fourth gate transistors, and a third inverting circuit having its input connected to the output of said second inverting circuit, and fifth and sixth gate transistors each connected between the output of said third inverting circuit and the input of said second inverting circuit, said fifth and sixth gate transistors being controlled by said first and second clock signals, respectively.

4. A digital integrated circuit according to claim 1, including a further gate transistor controllable by third clock signals, said further gate transistor being connected to receive said first and second data signals and to provide a signal to the input of said first inverting circuit.

5. Appratus according to claim 4, including another gate transistor connected in series with said third and fourth gate transistors.

6. Apparatus according to claim 1, including means for connecting a plurality of said multi-port flip-flops for operation as a shift register in response to clock signals from one of said first and second clock signals, for shifting in serial data.

7. Apparatus according to claim 1, including circuit means for connecting a plurality of said multi-port flip-flop circuits for operation as a pseudo random number generator in response to clock signals from one of said first and second clock signals.

8. Apparatus according to claim 1, including circuit means for connecting a plurality of said multi-port flip-flop circuits into a shift register, and means adapted to cause such shift register to shift out, under the control of clock pulses from said first clock pulse source, data corresponding to the previous state of said flip-flops.

9. Apparatus according to claim 1, including means for interconnecting a plurality of said multi-port flip-flops into a signature analysis register, and means adapted to provide an output under control of clock pulses from said first clock pulse source corresponding to the content of said signature analysis register.

10. Apparatus according to claim 1, including a third source of clock signals, each of said multi-port flip-flops being connected to said third source of clock signals to perform operations independently of each other in response to signals received from each of said three sources of clock signals, and including circuit means for interconnecting said flip-flops to allow operation in a normal mode, for causing said flip-flops to operate independently as D type flip-flops in response to said first clock signals, circuit means for interconnecting said flip-flops to operate as a shift register in response to said second clock signals, and circuit means for interconnecting said flip-flops to operate as a random data generator in response to said third clook signals.

11. Apparatus according to claim 1, including circuit means for interconnecting a plurality of said flip-flops to function selectively as a shift register or as a random generator in reponse to said first and second clock signals, respectively, and multiplexer means having an input connected to an output of one flip-flop and an output connected to a data input of another flip-flop, and means for controlling operation of said multiplexer in accordance with the selected function of said flip-flops.

12. A method of testing an integrated circuit made up of a plurality of interconnected clock flip-flop circuits and first and second sources of clock signals, one of said sources being active at a time, comprising the steps of:
   interconnecting said flip-flop circuits for normal operation to perform the functions of said digital integrated circuits when one of said first and second sources of clock pulse signals is applied thereto,
   arranging the connections of said plurality of said flip-flop circuits to constitute at least one shift register not employed in the normal operation of said digital integrated circuit whereby an arbitrary series of data bits may be shifted into said shift register in synchronism with the other of said first and second sources of clock pulses, whereby said plurality of flip-flops can be preset to a state corresponding to said arbitrary input data,
   and subsequently applying signals of the first of said first and second sources of clock signals for resuming normal operation of said digital and inverted circuit from the state corresponding to said arbitrary sequence of input data bits.

13. The method according to claim 12, including the step of using, for each of the flip-flops of said digital integrated circuit, a clock flip-flop having a pair of input gates
   maintaining one of said input gates blocked during normal operation of said digital integrated circuit, while said first source of said clock pulses is applied to said other input gate, for operating said data in accordance with input data supplied to said input gate, and alternatively blocking said second input gate and applying said second source of clock pulses to said first input gate, whereby data applied to the input of said second input gate, in the manner of a shift register, is applied to the input of said flip-flop.

14. The method according to claim 12, including the step of employing dynamic clock flip-flops for said flip-flop circuits.

15. The method according to claim 12, including the step of employing static clock flip-flops for said flip-flop circuits.

16. The method according to claim 12, including a step of employing flip-flops with three input gates for each of said flip-flop circuits, and applying clock pulses from a third source of clock signals to said integrated circuit for causing a plurality of said flip-flop circuits to function as a pseudo random generator in synchronism with the signals of said third source of clock signals.

* * * * *